(12) United States Patent
Chen

(10) Patent No.: US 9,900,165 B2
(45) Date of Patent: Feb. 20, 2018

(54) BATTERY POWERED POE AUDIO AMPLIFIER AND DEVICE

(71) Applicant: GuangDong Redx Electrical Technology Limited, Dongguan (CN)

(72) Inventor: Xue Jian Chen, Dongguan (CN)

(73) Assignee: GuangDong Redx Electrical Techno, Dongguan, Guangdong (CN)

( * ) Notice: Subject to any disclaimer, the term of this patent is extended or adjusted under 35 U.S.C. 154(b) by 0 days.

(21) Appl. No.: 15/291,052

(22) Filed: Oct. 11, 2016

(65) Prior Publication Data

US 2017/0104603 A1 Apr. 13, 2017

Related U.S. Application Data

(60) Provisional application No. 62/239,261, filed on Oct. 8, 2015.

(51) Int. Cl.
| | |
|---|---|
| *H04L 12/10* | (2006.01) |
| *H03F 3/183* | (2006.01) |
| *H03F 3/185* | (2006.01) |
| *H03F 3/217* | (2006.01) |

(52) U.S. Cl.
CPC ............ *H04L 12/10* (2013.01); *H03F 3/185* (2013.01); *H03F 3/2171* (2013.01); *H03F 3/2173* (2013.01); *H03F 2200/03* (2013.01)

(58) Field of Classification Search
CPC .... H03F 3/183; H03F 2200/03; H03F 3/2171; H03F 3/185; H03F 3/2173; H02J 3/02
See application file for complete search history.

(56) References Cited

U.S. PATENT DOCUMENTS

| | | | | |
|---|---|---|---|---|
| 7,294,940 | B2 * | 11/2007 | Grolnic ................. | G06F 1/30 307/22 |
| 2011/0310519 | A1 * | 12/2011 | Baba ..................... | H04N 5/63 361/91.1 |
| 2012/0023340 | A1 * | 1/2012 | Cheung ................. | G06F 1/266 713/300 |

* cited by examiner

*Primary Examiner* — Rexford Barnie
*Assistant Examiner* — Terrence Willoughby
(74) *Attorney, Agent, or Firm* — Jundong Ma

(57) ABSTRACT

Disclosed is a PoE apparatus deployed on the PD-side of a PoE configuration conforming to a PoE standard prescribing maximum power and current levels. The PoE apparatus comprises a current control element configured to draw from the PSE-side of the PoE configuration input current with input power and produce output current with output power, with the input current and power both respectively conforming to the maximum current and power levels of the PoE standard. The disclosed PoE apparatus further comprises a set of rechargeable batteries configured to be fully recharged by the aforementioned output current with the aforementioned output power at their respective levels and faithfully power the networked PoE device as a primary power source capable of producing instantaneous power large enough to meet the peak power requirement of the networked PoE device that is greater than the maximum power level of the PoE standard.

1 Claim, 9 Drawing Sheets

BATTERY POWERED POE AUDIO AMPLIFIER AND DEVICE

CROSS-REFERENCE TO RELATED APPLICATION

This application claims the benefit under 35 U.S.C. § 119(e) of Provisional Patent Application No. 62/239,261, filed Oct. 8, 2015, the entire disclosure of which is hereby incorporated by reference.

RELATED ART

A networked device with a built-in Ethernet interface (for networking) may be a device which requires relatively high transient power from time to time and therefore is not suitable to be powered by a built-in battery. Such a networked device usually cannot operate properly without having access to a steady and continuous external power supply, such as a nearby available electrical outlet. One example of such a networked device is a networked audio power amplifier with a built-in Ethernet interface. Another example of such a networked device is a networked audio power amplifier with a built-in Ethernet interface. For ease of discussion, such a networked audio power amplifier would be hereinafter used in the present patent application as a representative, or otherwise an example, of such a networked device to discuss PoE systems provided to power such a networked device. That is, such a networked audio power amplifier will be used in discussions of the present application for the purpose of illustration and not for the purpose of limitation. Such a networked audio power amplifier may be hereinafter simply referred to a "networked audio power amplifier," an "audio power amplifier," a "power amplifier," or an "amplifier."

At first, a networked audio power amplifier may be supplied with its input as well as control and monitoring via Ethernet. Later on, by Power over Ethernet (PoE), it is possible to provide the amplifier with continuous power as well, which sometimes means that an amplifier can be fully operating with a single cable. Power over Ethernet is standardized by IEEE and it allows 12-50W to be distributed over a twisted-pair Ethernet cable.

The original IEEE 802.3af-2003 standard, adopted in 2003, provides up to 15.4 watts of DC power at a PSE (Power Sourcing Equipment) and uses two of the four twisted pairs in the structured cabling. Because some power is dissipated in the cabling, only 12.95 watts are assured to be available at a PD (Powered Device). Or in other words, the maximum current which can be delivered is about 350 mA. The IEEE standard for PoE Plus—namely, IEEE 802.3at, ratified in 2009—permits a PSE to transmit up to an average DC power of up to 30 Watts and PDs to receive up to an average DC power of up to 25.5 watts over two twisted pairs, and a current of up to 600 mA.

FIG. 5 is a simplified chart illustrating a power density situation of a musical signal. As shown, when the music (audio) signal (outputted from an audio amplifier) drives a speaker, a transient current can be low or high (as reflected by the corresponding transient power shown in FIG. 5) even when the steady-state power is well within the PSE power limit (which, as discussed above, may be 12.95W or 25.5W, depending on the IEEE standard to which the PSE conforms).

FIGS. 1-4 are different views illustrating one or more configurations known in the related art, as relating to a PoE audio amplifier disclosed in Hultin, "A study of using IEEE 802.3at Power over Ethernet as a power source for a class-D audio amplifier," Chalmers University Of Technology, Department of Computer Science and Engineering, Sweden, January 2013, an article which is hereby incorporated by reference in its entirety. Specifically, FIG. 1 is a simplified schematic view showing two known general PoE configurations of a PSE delivering power to a PD, configurations which may be referred to as the "endpoint PSE" configuration and the "Midspan PSE" configuration. Hereinafter, as used herein, "the PSE-side" refers to the side of a general PoE configuration where a PSE is deployed or otherwise provided, and "the PD-side" refers to the side of a general PoE configuration where a PD is deployed or otherwise provided. As illustrated in FIG. 1, for either the "endpoint PSE" PoE configuration or the "Midspan PSE" PoE configuration, PoE is delivered from the PSE-side to the PD-side.

FIG. 2 is a simplified schematic of a known configuration of PD-interface. FIG. 3 is a block diagram illustrating a known PoE system of a PoE amplifier where a networked audio amplifier on the PD-side of an underlying general PoE configuration is powered by a transient power directly received from the PSE-side of the underlying general PoE configuration.

As a skilled artisan readily appreciates, for the known PoE system of FIG. 3, the transient power of its PSE supplies all the transient power ultimately driving a speaker (load) playing the digital audio. Going back to FIG. 5, for the illustrated musical signal, if a 12.95W PoE is used for the known PoE system of FIG. 3—which means that the PoE amplifier of the known PoE system may output a 12.95W average power—then the peak power (transient power) can be as high as 12.95W×4=64.75W, a transient power which, if realized, is well over the PoE power limit of 12.95W, and as a result cannot be sustained, and thus cannot be supported, by the known PoE system of FIG. 3 itself.

FIG. 4 is another simplified chart illustrating a continuous output power situation (with respect to the PoE amplifier) for the known PoE system of FIG. 3. As shown in FIG. 4, when the PSE current reaches any of the aforementioned current limits (depending on the IEEE standard to which the PSE conforms) due to, e.g., a requirement of a much-higher-than-average transient power (such as a peak power) as present in an audio signal, the PSE simply cannot satisfy or otherwise sustain such a power requirement, and will be getting into a protection mode with the whole PoE system being forced to shut down. As result, a PoE audio amplifier deployed in this known PoE system of FIG. 3, or in a similar PoE system, is currently limited to low power, a situation which severely confines the usefulness and appeal of PoE as an alternative steady and durable power source, and therefore is usually not desirable.

BRIEF SUMMARY

In one aspect, the present disclosure provides a PoE apparatus deployed on the PD-side of a first PoE configuration conforming to a first PoE standard prescribing a first maximum power level and a first maximum current level. The first PoE configuration is configured to connectively and communicatively include a networked PoE device within a local communication network of the first PoE configuration through an Ethernet interface. The PoE apparatus comprises a current control element configured to interface with a PD-interface of the first PoE configuration, draw from the PSE-side of the first PoE configuration through the PD-interface a first input current of a second current level with a first input power of a second power level, and produce a first output current of a third current level with a first output power of a third power level as a result of receiving the first input current with the first input power, with the second power level being no higher than the first maximum power level of the first PoE standard and the second current level being no higher than the first maximum current level of the first PoE standard.

The provided PoE apparatus further comprises a rechargeable battery unit comprising a set of one or more rechargeable batteries. The set of one or more rechargeable batteries is configured to receive the first output current with the first output power so that the set of one or more rechargeable batteries is recharged as a result of receiving the first output current with the first output power, with the third current level and the third power level configured to enable the first output current with the first output power to fully charge the set of one or more rechargeable batteries. The set of one or more rechargeable batteries is configured to faithfully power the networked PoE device as a primary power source such that the set of one or more rechargeable batteries is configured to produce instantaneous power large enough to meet a peak power requirement of the networked PoE device that is greater than the first maximum power level of the first PoE standard.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures, unless expressly specified, have not necessarily been drawn to scale. Also, any text and/or any numerical data (numbers) appeared on any drawing figures is provided to illustrate an exemplary embodiment or implementation, and thus is provided for the purpose of illustration and not for the purpose of limitation. For example, the dimensions of some of the elements may be exaggerated relative to other elements. Embodiments incorporating teachings of the present disclosure are shown and described with respect to the figures presented herein, in which.

DETAILED DESCRIPTION

Figure 1:
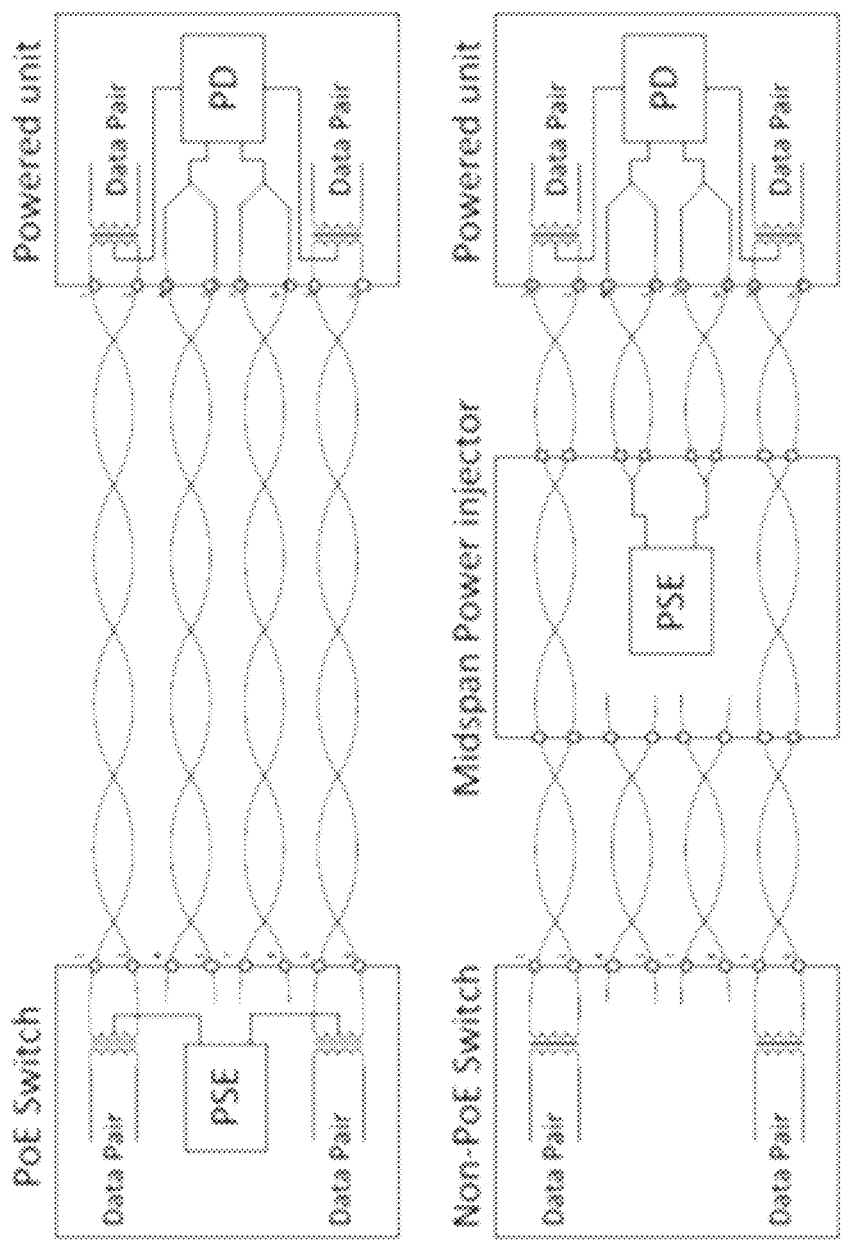
FIG. 1 is a simplified schematic view showing two known general PoE configurations of a PSE delivering power to a PD, configurations.
Figure 2:
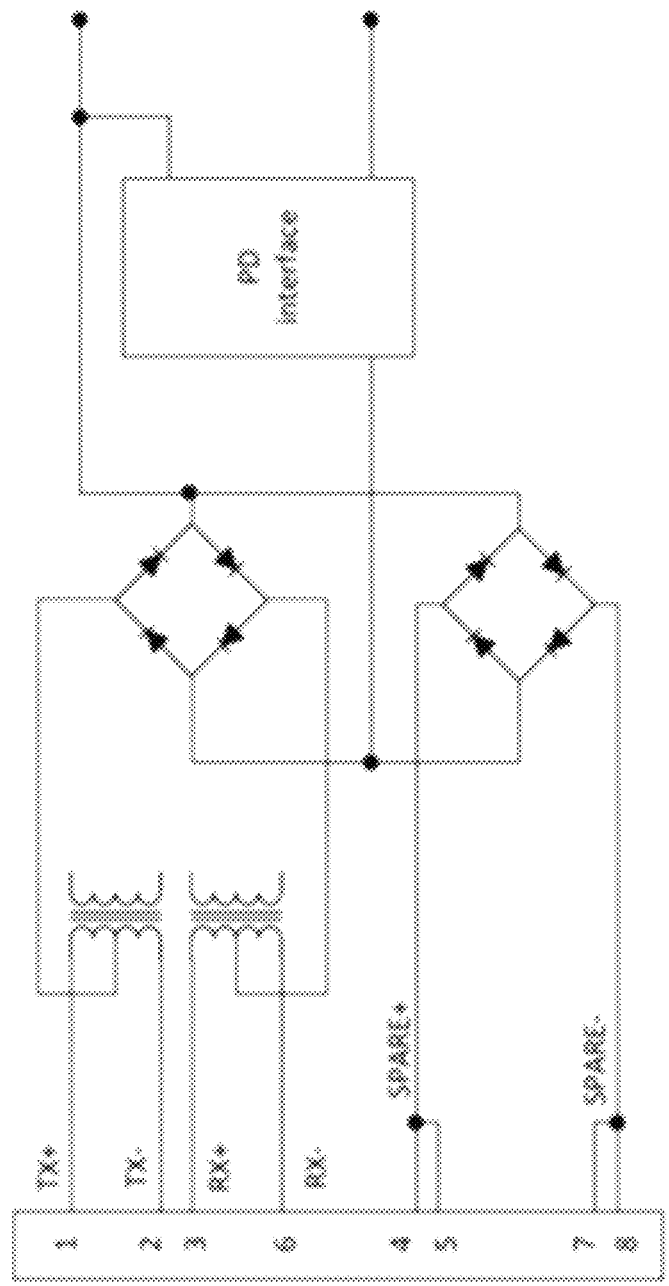
FIG. 2 is a simplified schematic of a known configuration of PD-interface.

In the following detailed description of exemplary embodiments of the disclosure in this section, specific exemplary embodiments in which the disclosure may be practiced are described in sufficient detail to enable those skilled in the art to practice the disclosed embodiments. However, it is to be understood that the specific details presented need not be utilized to practice embodiments of the present disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. Moreover, the use of the terms first, second, etc. do not denote any order or importance, but rather the terms first, second, etc. are used to distinguish one element from another.

Those of ordinary skill in the art will appreciate that the components and basic configuration depicted in the following figures may vary. Other similar or equivalent components may be used in addition to or in place of the components depicted. A depicted example is not meant to imply limitations with respect to the presently described one or more embodiments and/or the general disclosure.

As used herein, the maximum power which a general PoE configuration can provide from its PSE (under a specific IEEE standard to which the PoE conforms)—such as the 12.95W maximum power provided under the IEEE 802.3af-2003 standard or the 25.5W maximum power provided under the IEEE 802.3at—will be simply referred to as the "PSE power limit" of the general PoE configuration. Similarly, the maximum current which a general PoE configuration can deliver to its PD-side from its PSE-side (under a specific IEEE standard to which the PoE conforms)—such as the aforementioned 350 mA maximum current delivered under the IEEE 802.3af-2003 standard or the aforementioned 600 mA maximum current delivered under the IEEE 802.3at—will be simply referred to as the "PSE current limit" of the general PoE configuration.

Figure 3:
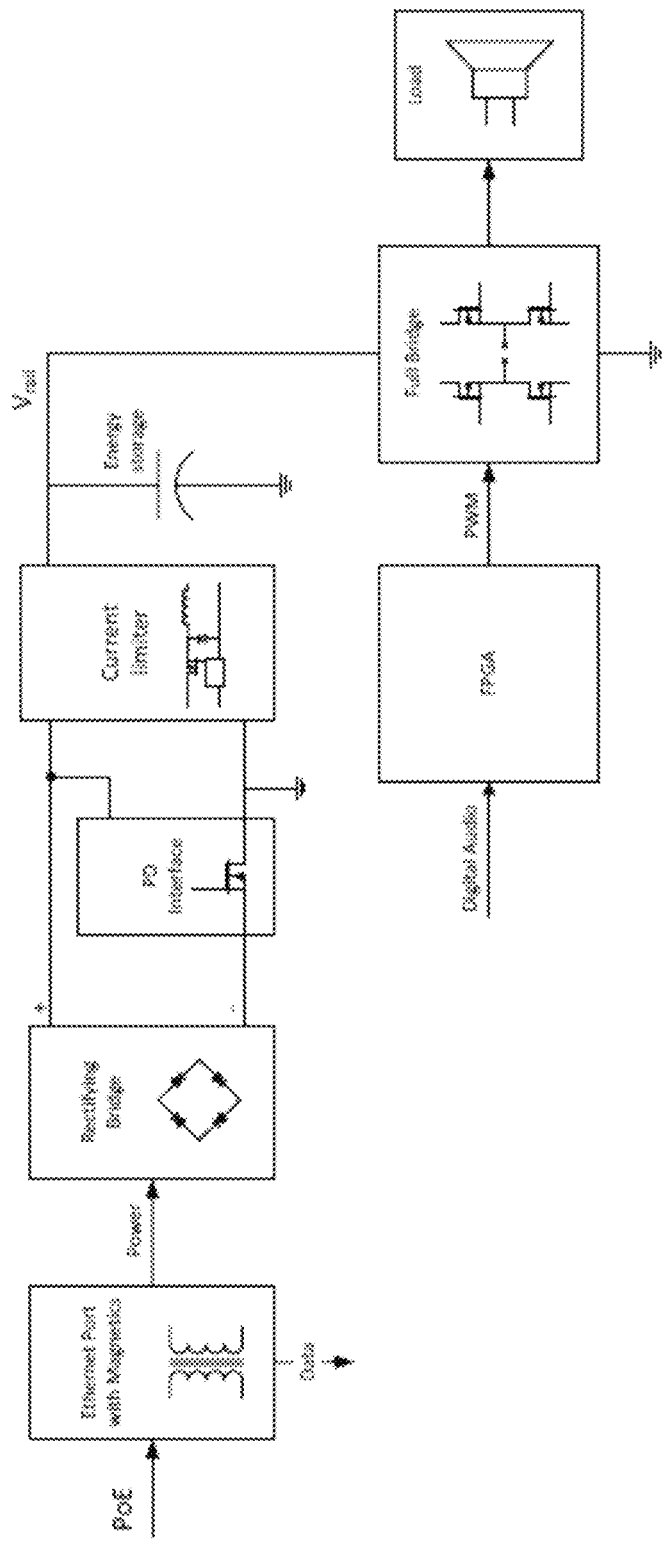
FIG. 3 is a block diagram illustrating a known PoE system of a PoE amplifier where a networked audio amplifier on the PD-side of an underlying general PoE configuration is powered by a transient power directly received from the PSE-side of the underlying general PoE configuration.
Figure 4:
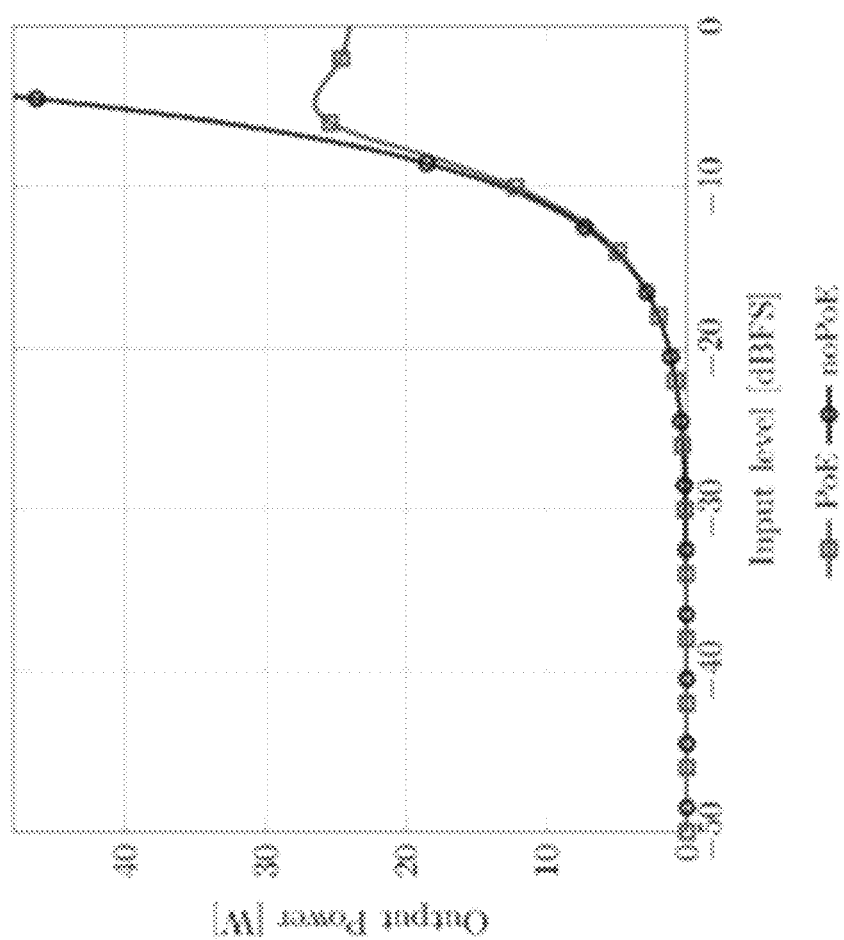
FIG. 4 is a simplified chart illustrating a continuous output power situation (with respect to a PoE amplifier) for the known PoE system of FIG. 3.
Figure 5:
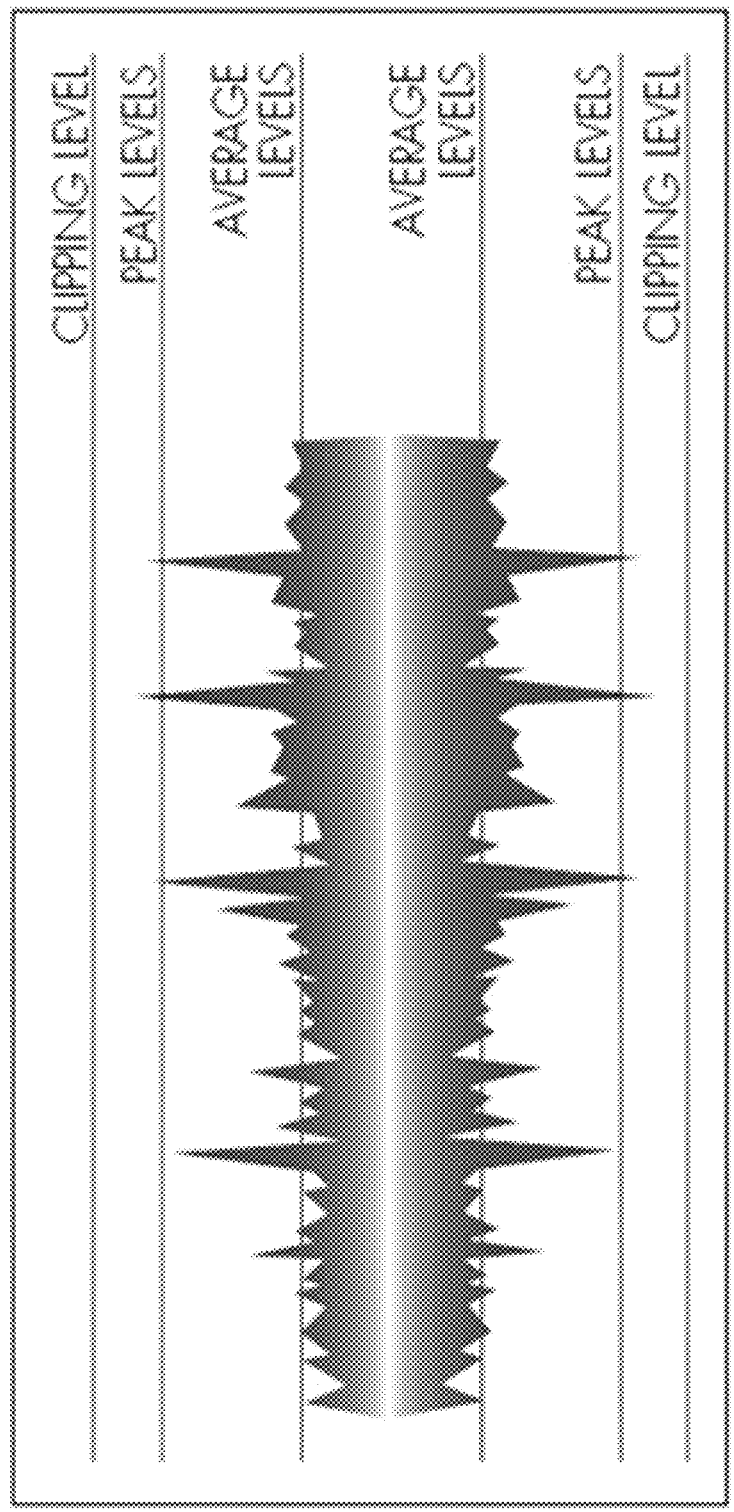
FIG. 5 is a simplified chart illustrating a known power density situation of a musical signal.

As used herein, the term "PoE amplifier" (or otherwise the term "PoE device") refers to a powered amplifier (or otherwise a powered device) deployed or otherwise provided on the PD-side of a general PoE configuration, with the powered amplifier (or otherwise the powered device) powered by power either directly received from, or indirectly originated from, the PSE-side of the general PoE configuration. A networked amplifier on the PD-side of the known PoE system of FIG. 3 is an example of a PoE device or a PoE amplifier. A battery-powered networked device on the PD-side of the disclosed novel PoE system, as illustrated in FIGS. 6-8, is another example of a PoE device or a PoE amplifier.

As used herein, "a general PoE configuration" may refer to an underlying PoE illustrated or otherwise exemplified in high level in FIG. 1. As used herein, "a PoE system" may refer to any system which, in high level, conforms to a general PoE configuration, with at least one PoE device deployed on the PD-side of the conformed general PoE configuration. One example of a PoE system is the know system illustrated in FIG. 3. Another example of a PoE system is the disclosed novel system illustrated in FIGS. 6-8.

Figure 6:
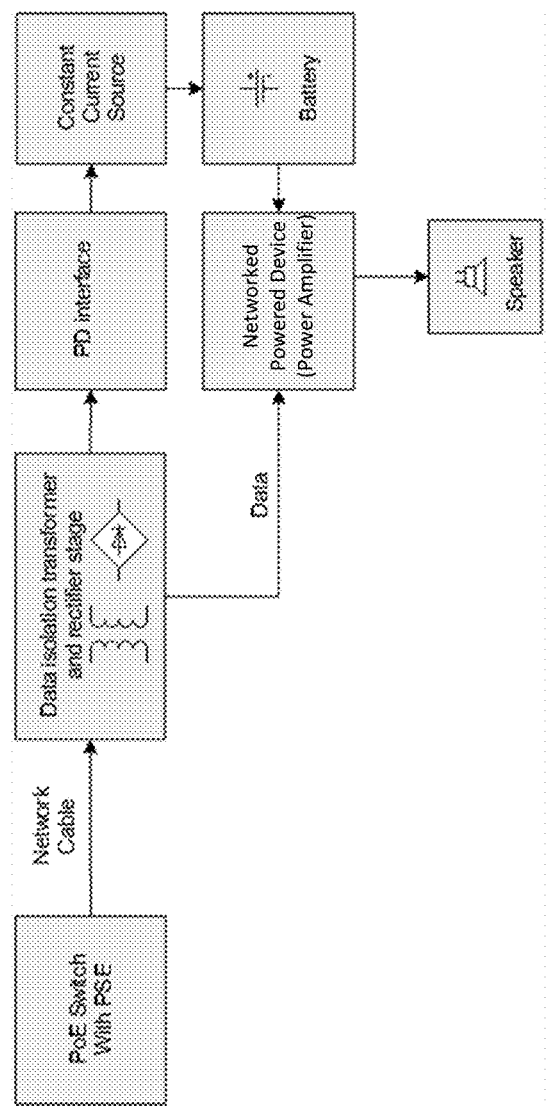
FIG. 6 is a simplified diagram illustrating the disclosed innovative and novel PoE system of a battery-powered PoE amplifier, in accordance with one or more embodiments of the present disclosure.

FIG. 6 is a diagram illustrating the disclosed innovative and novel PoE system of a battery-powered PoE amplifier, a PoE system which is configured to, inter alia, use a constant current source to charge a battery unit made up of a group of one or more rechargeable batteries and use the charged battery unit to power a networked PoE device (such as a networked PoE audio power amplifier), in accordance with one or more embodiments of the present disclosure.

Figure 7A:
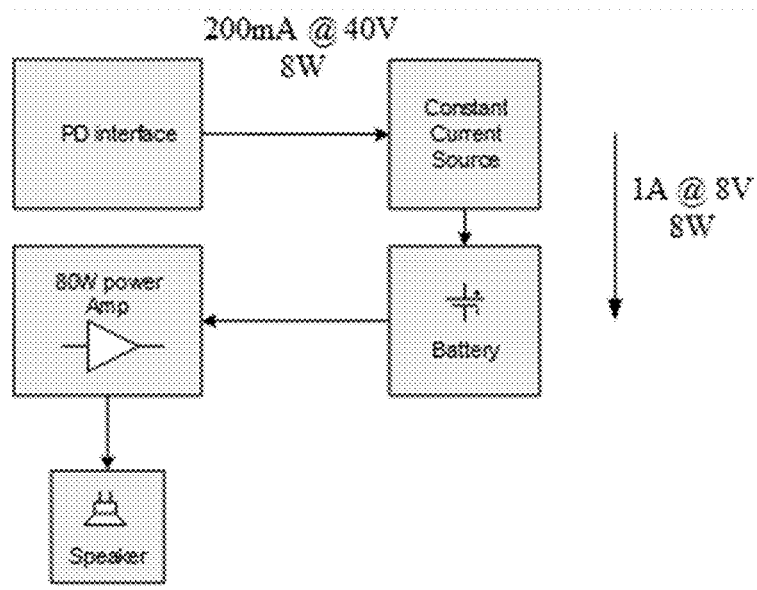
FIGS. 7A-B are simplified diagrams illustrating two exemplary configurations of the disclosed novel PoE system, in accordance with one or more embodiments of the present disclosure.
Figure 7B:
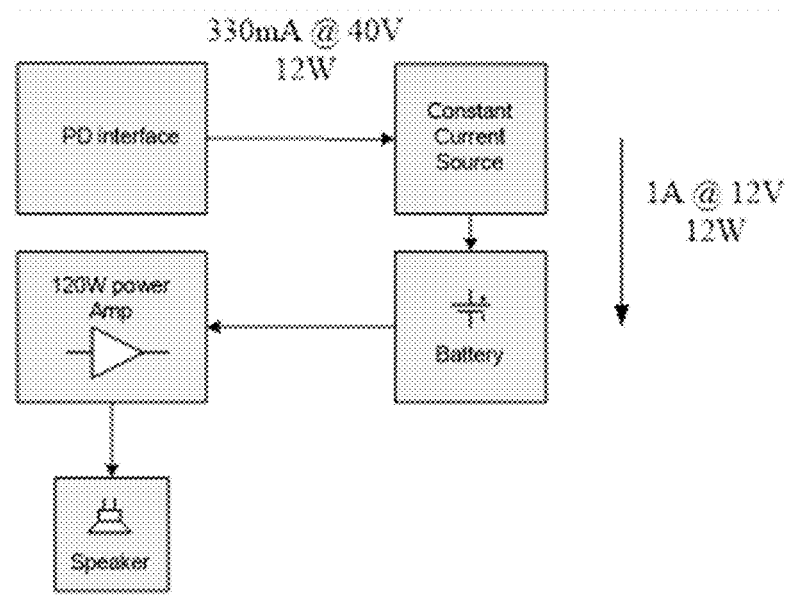
Figure 8:
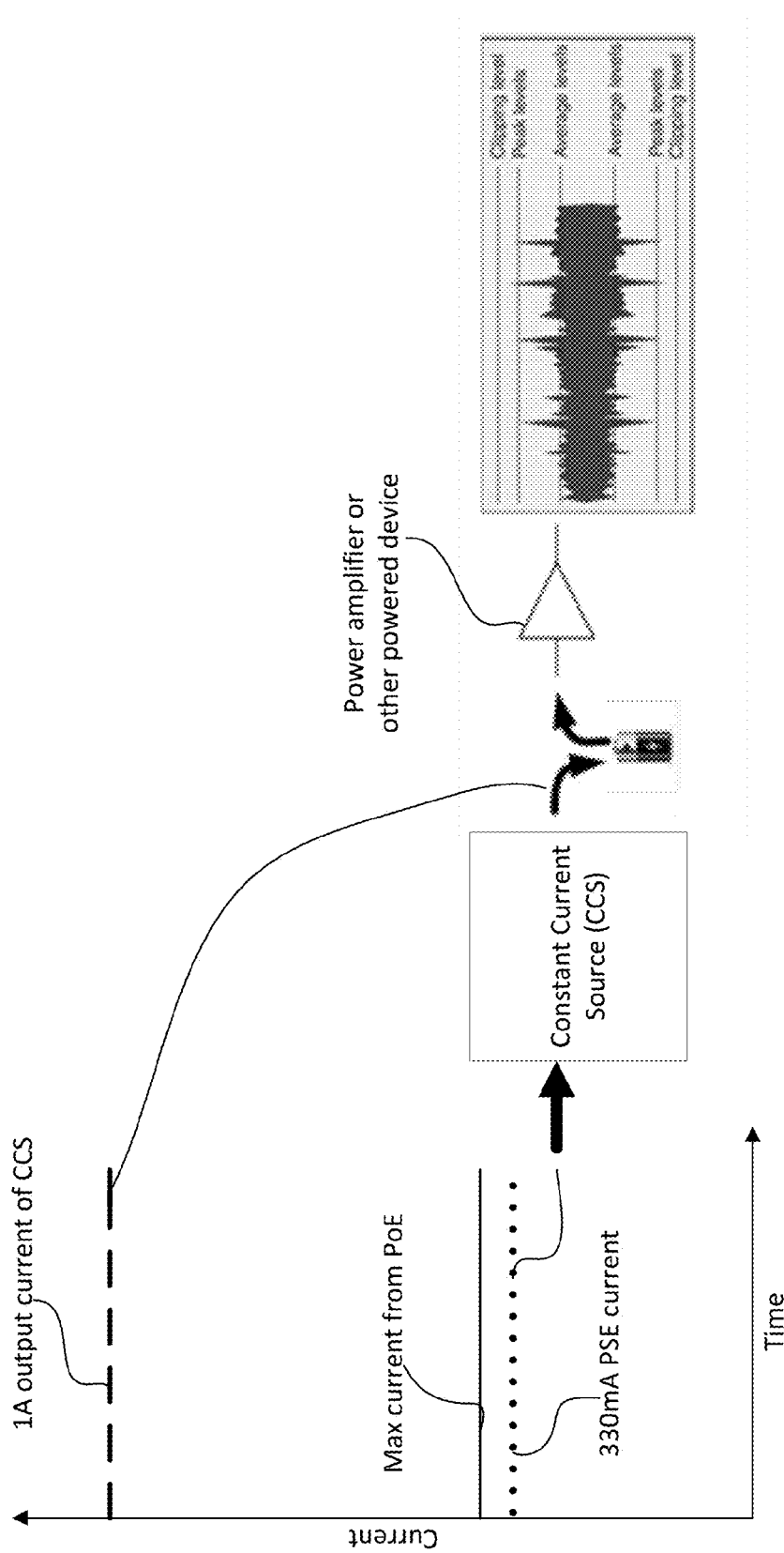
FIG. 8 is another diagram illustrating the exemplary configuration of the disclosed PoE system illustrated in FIG. 7B, in accordance with one or more embodiments of the present disclosure.

FIGS. 7A-B are diagrams illustrating two exemplary configurations of the disclosed novel PoE system, both of which are in accord with the diagram of the disclosed PoE system illustrated in FIG. 6. Under each of these two exemplary configurations, for the respective constant current source (hereinafter referred to as "CCS"), given that its respective input power must be within (equal to or below) the PSE power limit of the respective general PoE configuration, the respective CCS is configured to pull from the PSE-side a respective constant current (through a known PD interface) below the PSE current limit of the respective general PoE configuration. On the other hand, the respective CCS, by physics principles, cannot yield its respective output power that is bigger than its respective input power, and therefore can only yield its respective output power that is within the PSE power limit of the respective general PoE configuration. Given its respective limited output power, the respective CCS is further configured to output a respective sufficiently high output voltage (namely, being sufficiently higher than, e.g., the aggregate voltage of the respective group of rechargeable batteries of the respective battery unit) for charging the respective rechargeable batteries, and a respective sufficiently strong output current (charging current) for charging the respective rechargeable batteries, thereby enabling successful charging of the respective rechargeable batteries with the respective CCS' output power.

More specifically, for the exemplary configuration illustrated in FIG. 7A where its general PoE configuration conforms to the IEEE 802.3af-2003 standard, given that the input power of its CCS is within (equal to or below) its 12.95W PSE power limit, its CCS is configured to pull from the PSE-side a constant current of 200 mA, which is below the 350 mA PSE current limit of PoE. Hereinafter, the exemplary configuration illustrated in FIG. 7A will be simply referred to as "the 200 mA configuration."

On the other hand, as has been discussed above, the CCS can only yield an output power that is below the 12.95W PSE power limit. In particular, the exemplary CCS is configured to receive the 200 mA input current at an input voltage of 40V, thereby receiving an input power of 8W, an input power which is below the 12.95W PSE power limit of the general PoE configuration. In this exemplary configuration of the disclosed PoE system, the battery unit may be made up of a group of two 3.7V rechargeable batteries designed to work with the output current, output voltage, and the output power of the CCS, as will be further discussed below.

Turning to the output aspect of the CCS, given its limited output power, the CCS is further configured to output an output voltage of 8V (which is sufficiently high than, e.g., a maximum 7.4V combined (aggregate or total) voltage for the two 3.7V rechargeable batteries, and as a result is sufficiently high for charging the two rechargeable batteries) and output current of 1 amp (which is a sufficiently strong current for charging the two rechargeable batteries), thereby enabling successful charging of the two rechargeable batteries with the CCS' output power.

It is worth noting that the 200 mA configuration also works for a general PoE configuration conforming to the aforementioned IEEE 802.3at standard (where the PSE power limit is 25.5W and the PSE current limit is 600 mA) or any other IEEE standard where the respective PSE power limit and the respective PSE current limit are respectively higher than the 12.95W PSE power limit and the 350 mA PSE current limit of the aforementioned IEEE 802.3af-2003 standard.

It is also worth noting that the 200 mA configuration is capable of powering an 80W networked audio power amplifier, primarily due to that a 3.7V rechargeable battery (such as a 3.7 lithium battery) is known to be capable of supplying a 20-amp transient current.

The exemplary configuration illustrated in FIG. 7B is similar to the afore-discussed 200 mA configuration illustrated in FIG. 7A, except for the input power, the input current, input voltage, the output power, the output current, and the output voltage of its CCS as well as the number of rechargeable batteries of which its battery unit may be made up.

More specifically, in the exemplary configuration illustrated in FIG. 7B, its general PoE configuration conforms to the IEEE 802.3af-2003 standard where the PSE power limit is 12.95W and the PSE current limit is 350 mA. Thus, its general PoE configuration also conforms to any other standard (such as the IEEE 802.3at) where the respective PSE power limit is even higher than 12.95W and the respective PSE current limit is even higher than 350 mA. The input power and the input current of its CCS are 12W and 330 mA, which are below the 12.95W PSE power limit and the 350 mA PSE current limit of the underlying PoE, respectively. Hereinafter, the exemplary configuration illustrated in FIG. 7B will be simply referred to as "the 330 mA configuration."

For the 330 mA configuration, with its 12W CCS input power (namely, the input power which its CCS may pull in from its PSE-side) being significantly higher than the corresponding 8W CCS input power of the 200 mA configuration, its 12W CCS output power (which is used to charge rechargeable batteries) is also significantly higher than the corresponding 8W CCS output power of the 200mA configuration. Accordingly, the 330 mA configuration may support a battery unit having a group of three 3.7V rechargeable batteries, which is one rechargeable battery more than than the group of two rechargeable batteries of the battery unit of the 200 mA configuration may have. The output current (charging current) and the output voltage of its CCS are 1 amp and 12V—which are sufficiently high to charge the aforementioned three 3.7V rechargeable batteries in terms of charging current and charging voltage, respectively—thereby enabling successful charging of the three aforementioned rechargeable batteries with the CCS' output power.

FIG. 8 is another diagram illustrating the exemplary 330 mA configuration of the disclosed novel system of a battery-powered PoE amplifier as shown in FIG. 7B, particularly in terms of how the above-discussed different current levels are leveraged by the respective underlying general PoE configuration (the underlying PoE), the respective CCS, and the respective battery unit of rechargeable batteries, to realize faithful powering of a networked PoE audio power amplifier. As illustrated, at a first step, the disclosed novel system of a battery-powered PoE amplifier, through its CCS, draws a continuous but relatively low constant PSE current, and converts the low constant PSE current to a relatively high constant current. Then, the disclosed PoE system is configured to have the converted relatively high constant current charge the group of one or more rechargeable batteries of its battery unit. Next, the battery unit of rechargeable batteries, when adequately charged, is able to supply a relatively low, or a relatively high, transient current and power to a networked PoE audio amplifier on an as needed basis in accordance with the current and power requirements of an audio signal (such as a musical signal) to be outputted by the PoE audio amplifier.

Unlike the known PoE system of FIG. 3—where if an audio signal outputted by its PoE amplifier requires that a transient output current of its PoE amplifier be higher than its PSE current limit, the known PoE system will be forced to shut down—the disclosed PoE system can have its battery-powered PoE amplifier output a transient current higher, or even much higher, than its relatively low PSE current limit without being forced to shut down.

Putting it differently, with its novel configuration of having an above-discussed CCS and an above-discussed battery unit of a group of one or more rechargeable batteries behind its PD-interface, the disclosed PoE system manages to sustain a transient ouput current of its PoE amplifier that is higher (or even much higher) than its PSE current limit without changing (or otherwise affecting) the underlying general PoE configuration (including the underlying current and power requirements) which the disclosed PoE system bases off, thereby enabling a PoE amplifier not to be undesirably handicapped or otherwise limited by the current and power limitations of the underlying general PoE configuration.

Figure 9:
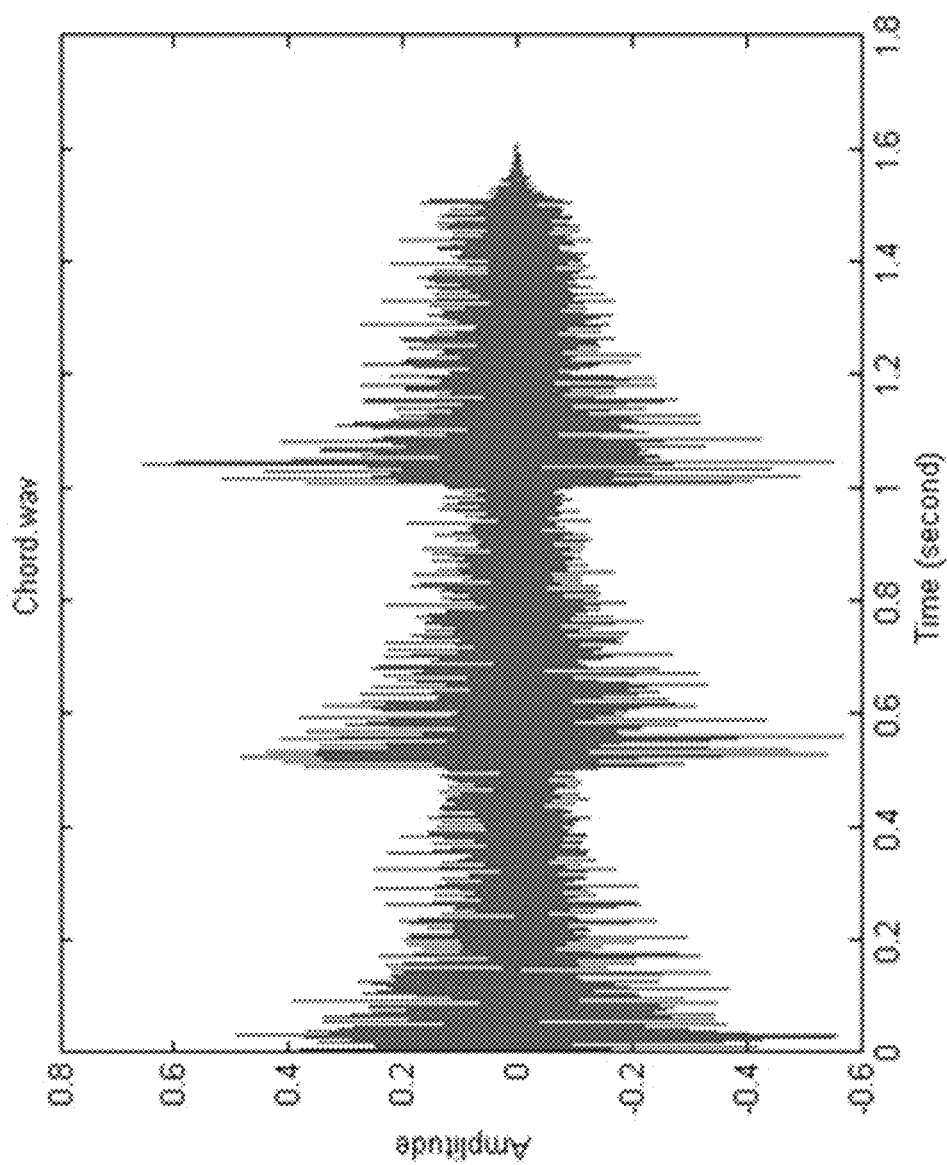
FIG. 9 illustrates an exemplary musical signal with an extraordinarily high peak-power-to-average-power ratio, the musical sign which may be faithfully produced by the exemplary configuration of the disclosed PoE system illustrated in FIG. 7B.

FIG. 9 illustrates an exemplary musical signal with an extraordinarily high peak-power-to-average-power ratio. As discussed above, with its approach of forming a battery-powered PoE amplifier (namely, using its one or more rechargeable batteries on the PD-side to supply a transient output current and power to a networked PoE amplifier), the disclosed PoE system can use a single 3.7V lithium battery to supply a 20-amp transient output current of its PoE amplifier. Thus, the exemplary 330 mA configuration of the disclosed PoE system, with its three 3.7V rechargeable batteries, can have a 120W PoE power amplifier to faithfully output a musical signal having a peak-to-average power situation as extraordinary as the power situation illustrated in FIG. 9, with all peak power (as required for the musical signal) of the 120W PoE amplifier being supplied from the group of three rechargeable batteries of its battery unit.

As illustrated in FIG. 6, under the disclosed innovative PoE system of a battery-powered PoE amplifier, the battery unit of rechargeable batteries can power any suitable networked device. A skilled artisan readily appreciates that such a suitable networked device may be one which has an average power that is within the PSE power limit of the underlying general PoE configuration (under an IEEE standard) and may occasionally (or even frequently) have a peak power (or otherwise a transient power) that is higher (or even much higher) than its average power. As has been discussed, a networked audio amplifier may be such a suitable networked device, given that an audio amplifier usually outputs an audio signal that usually has a relatively low average power and occasionally has a peak power higher or much higher than the average power. One example of such a suitable audio amplifier is an audio power amplifier with a topology that yields an ultra-high efficiency for power amplification. One instance of such a topology is that of a super high efficiency single-stage power amplifier disclosed in US Patent Publication No. 2014/0159811 to Chen, which is hereby incorporated by reference in its entirety. Another example of such a suitable networked device may be a conventional Class-D power amplifier.

Such a suitable networked device, as has been discussed above, is not limited to a networked audio amplifier. For example, such a suitable networked device may be a networked security camera, which occasionally requires a relatively high transient power when its turning motor is activated to turn itself to face different directions while requires no power or relatively low transient power for the most time when its turning motor is deactivated. There are lots of other examples of such a suitable networked device, as a skilled artisan appreciates.

As can be readily observed of the disclosed PoE system (e.g. through the exemplary 200mA configuration and the exemplary 330 mA configuration thereof), the PSE-supplied power of a relatively low transient current is ultimately converted (transformed) to a battery-supplied power which can be of a much higher transient current (relative to the low transient current supplied by the PSE of the respective general PoE configuration) when occasionally (or even frequently) required from a PoE amplifier. This is an innovative approach of Applicant that is completely absent in a conventional PoE system such as the known PoE system of FIG. 3.

More specifically, Applicant's innovative approach lies in creating an indirect power source (such as the battery unit of the disclosed PoE system, which is formed of a group of rechargeable batteries) from a direct PoE source (namely, the PSE of a general PoE configuration) and using the indirect power source—which is not subject to the PSE power and current limits of a direct PoE source—to supply a transient power to a networked audio amplifier. The term "indirect", as used in the term "indirect power source", is in relation to or otherwise with respect to, the PSE-side of a general PoE configuration (namely, an underlying PoE) as a direct power source relied upon by a conventional PoE system to power its PoE device.

As described above in connection with the disclosed PoE system of a battery-powered PoE amplifier, the indirect power source (namely, the battery unit of the group of one or more rechargeable batteries), during the course of powering the networked audio amplifier when the direct PoE source is actively supplying power, may derive its power exclusively from the direct PoE source. That is, the power supplied by the indirect power source (to power the networked audio amplifier), on one hand, may be exclusively originated and derived from the PSE-side of the general PoE configuration without any need to also have access to a power source other than the direct PoE source (namely, the PSE of the general PoE configuration). The power supplied by the indirect power source, on the other hand, is not subject to the relatively low PSE power and current limits (restrictions) imposed on the power directly supplied from the direct PoE source. Accordingly, Applicant's innovative approach in effect converts an undesirably restrictive direct power source (namely, a direct PoE source) to a much less restrictive indirect power source, thereby greatly expanding ranges of PoE devices that can properly operate within a PoE system (basing off and conforming to an underlying general PoE configuration). Accordingly, with the disclosed novel PoE system, PoE devices are no longer just limited to devices which only require low power, as is the case for a conventional PoE system, but are expanded to vast ranges of devices which occasionally require high power, thereby greatly increasing the usefulness and appeal of PoE as an alternative steady and durable power source.

Also, in creating the indirect power source from the direct PoE source, the innovative and groundbreaking nature of Applicant's approach is fully demonstrated.

Firstly, Applicant's approach takes advantage of a first aspect of a general PoE configuration—namely, the aspect that the PSE-side of a general PoE configuration can continuously supply power (current) to PD-side so long as the PSE-supplied power does not exceed either of the PSE power and current limits. By way of example and not limitation, Applicant's approach uses a CCS to continuously draw from the PSE-side a constant current (below the PSE current limit), even when a PoE device (such as a PoE amplifier) does not require an output current as high as the pulled-in constant current. By taking advantage of this first aspect of a general PoE configuration, Applicant's approach in effect enables the disclosed PoE system, with the provision of the indirect power source, to continuously draw, store, and accumulate energy supplied from the PSE-side (through the use of, e.g., one or more rechargeable batteries) even at times when a PoE amplifier does not require output an amount of energy as high as the amount of energy flowing from the PSE-side.

By contrast, the known PoE system of FIG. 3 (or any other similar conventional PoE system) is not designed to take advantage of the above-discussed first aspect of a general PoE configuration. A skilled artisan appreciates that the PoE system of FIG. 3 is mostly designed to draw (from the PSE-side) an amount of transient power in accord with how big of a transient input power of the PD-side which its PoE amplifier needs to generate a transient output power (such as a peak power). This observation can be readily made from the system's use of a capacitor for energy storage on its PD-side. Briefly, a skilled artisan appreciates that due to the nature of a capacitor—namely, that a capacitor, due to having a very high power-density but a very low energy-density, is only suitable for buffering and releasing transient energy but is not suitable for storing sufficient amount energy over a period of time for ultimately becoming a viable indirect power source capable of faithfully powering a PoE device in accord with the current and power requirements thereof (as is the case for a group of one or more rechargeable batteries)—the system's use of a capacitor for energy storage on the PD-side is to buffer transient energy such that PD-side ends up drawing (from the PSE-side) an amount of transient power commensurate with how big of a transient input power of the PD-side which its PoE amplifier needs to generate a transient output power (such as a peak power). Thus, if the PoE amplifier only requires a transient output power much smaller than the PSE power limit, the PSE-side of the PoE system of FIG. 3 ends up supplying a comparable amount of transient power that may be much smaller than the PSE power limit.

Accordingly, the PoE system of FIG. 3 (or any other similar conventional PoE system) is simply not designed to take advantage of the above-discussed first aspect of a general PoE configuration, as is the case for Applicant's approach. As a result of this nature, the PoE system of FIG. 3 (or any other similar conventional PoE system) is forced to limit its PoE device to a device that requires only low power, which substantially confines the usefulness and appeal of PoE as an alternative steady and durable power source. Thus, Applicant's approach in connection with taking advantage of the above-discussed first aspect of a general PoE configuration is demonstrably innovative and groundbreaking, in view of this nature of a conventional PoE system such as the PoE system of FIG. 3.

Secondly, Applicant's approach advantageously circumvents, and therefore overcomes, an undesirable second aspect of a general PoE configuration—namely, the undesirable aspect that a general PoE configuration cannot have its PSE-side supply its PD-side a transient power of a transient current exceeding the PSE current limit when the PSE-supplied transient power is directly used (or otherwise directly relied upon) to power a PoE device (such as a PoE amplifier). Due to this undesirable aspect of a general PoE configuration, a PoE device of a conventional PoE system (such as the known PoE system of FIG. 3) is limited to a device requiring only low power. With Applicant's approach, the PSE-supplied transient power is not directly used (or otherwise directly relied upon) to power a PoE device on the PD-side. That is, the PSE-supplied transient power is not the direct power source which supplies a transient power to generate a transient output power of the PoE device. Instead, the PSE-supplied transient current is converted to a charging current used to charge, by way of example and not limitation, a group of rechargeable batteries of a battery unit, so that the battery unit, once given adequate amount of time to be adequately charged (as is usually the case for an above-discussed suitable PoE device), becomes the indirect power source that is not subject to any of the aforementioned PSE current and power limitations. As such, with the indirect power source being used to directly power a PoE device, the disclosed PoE system, as a whole, no longer requires that its PoE device be limited to a low power device (as is the case for the known PoE system of FIG. 3 or any other similar conventional PoE system).

By contrast, the known PoE system of FIG. 3 (or any other similar conventional PoE system) is not designed to circumvent the above-discussed undesirable second aspect of a general PoE configuration. As discussed above, a skilled artisan appreciates that the PoE system of FIG. 3 is mostly designed to draw (from the PSE-side) an amount of transient power in accord with how big of a transient input power of the PD-side which its PoE amplifier needs to generate a transient output power (such as a peak power). A skilled artisan also appreciates that the PoE system of FIG. 3 in effect put its PoE amplifier, as far as the maximum transient output current and power of its PoE amplifier are concerned, entirely at the mercy of the maximum transient current and power which its PSE-side is capable of supplying.

That is, the PoE system of FIG. 3 simply does not incorporate any means which may enable its PoE amplifier, as far as the maximum transient output current and power of its PoE amplifier are concerned, not to be subject to the transient current and power limitations of its PSE-side. As such, the PoE system of FIG. 3 (or any other similar conventional PoE system) is forced to limit its PoE device to a device that requires only low power, which undesirably confines the usefulness and appeal of PoE as an alternative steady and durable power source. Accordingly, Applicant's approach in connection with providing means to circumvent (and therefore overcome) the undesirable second aspect of a general PoE configuration is demonstrably innovative and groundbreaking, in view of this nature of a conventional PoE system such as the PoE system of FIG. 3.

To summarize, Applicant's approach of creating an indirect power source from a direct PoE source (of a general PoE configuration) and using the indirect power source to power a PoE device, is innovative and groundbreaking. This is demonstrated by Applicant's choosing to take advantage of the above-discussed first aspect of a general PoE configuration by using a CCS to continuously draw from the PSE-side a constant current (below the PSE current limit) without regard to the transient output power or current requirement of a PoE device of the general PoE configuration. This is also demonstrated by Applicant's managing to circumvent (and therefore overcome) the above-discussed undesirable second aspect of a general PoE configuration by not directly using or otherwise directly relying upon PSE-supplied transient power to power the PoE device, and instead converting the PSE-supplied transient current to a charging current subsequently used to charge, e.g., a group of rechargeable batteries of a battery unit so that the battery unit becomes a viable indirect power source not subject to any of the PSE current and power limitations of the underlying general PoE configuration.

The known PoE system of FIG. 3 (or any other similar conventional PoE system) is simply devoid of any of the afore-discussed innovative and groundbreaking aspects that comes with Applicant's approach, and as a result is forced to limit its PoE device to a device that only requires low power (namely, the 12W PSE power limit of its underlying general PoE configuration), a limitation which severely confines the usefulness and appeal of PoE as an alternative steady and durable power source. As demonstrated by its two exemplary configurations (namely, the 200 mA and 330 mA configurations), the disclosed PoE system of a battery-powered PoE device enables the respective PoE device to output a peak power (namely, 80W or 120W) which is much higher than the PSE power limit (namely, 12W) of the respective general PoE configuration. Accordingly, the disclosed PoE system greatly expands the ranges of devices that can properly operate as a PoE device within a general PoE configuration without any need to have access to an additional power source other than the direct PoE source of the respective general PoE configuration, thereby greatly increasing the usefulness and appeal of PoE as an alternative steady and durable power source.

While the disclosure has been described with reference to one or more exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure.

What is claimed is:

1. A PoE apparatus deployed on the PD-side of a first PoE configuration conforming to a first PoE standard prescribing a first maximum power level and a first maximum current level, the first PoE configuration configured to connectively and communicatively include a networked PoE device within a local communication network of the first PoE configuration through an Ethernet interface, the PoE apparatus comprising:

a current control element configured to interface with a PD-interface of the first PoE configuration, draw from the PSE-side of the first PoE configuration through the PD-interface a first input current of a second current level with a first input power of a second power level, and produce a first output current of a third current level with a first output power of a third power level as a result of receiving the first input current with the first input power, the second power level being no higher than the first maximum power level of the first PoE standard and the second current level being no higher than the first maximum current level of the firs PoE standard; and a rechargeable battery unit comprising a set of one or more rechargeable batteries, the set of one or more rechargeable batteries configured to receive the first output current with the first output power so that the set of one or more rechargeable batteries are recharged as a result of receiving the first output current with the first output power, the third current level and the third power level configured to enable the first output current with the first output power to fully charge the set of one or more rechargeable batteries, the set of one or more rechargeable batteries configured to faithfully power the networked PoE device as a primary power source such that the set of one or more rechargeable batteries produces instantaneous power large enough to meet a peak power requirement of the networked PoE device that is greater than the first maximum power level of the first PoE standard.

* * * * *